(12) United States Patent
Liu et al.

(10) Patent No.: US 7,932,144 B2
(45) Date of Patent: Apr. 26, 2011

(54) SEMICONDUCTOR STRUCTURE AND METHOD OF FORMING THE STRUCTURE

(75) Inventors: Yaocheng Liu, Elmsford, NY (US); Shreesh Narasimha, Beacon, NY (US); Katsunori Onishi, Fishkill, NY (US); Kern Rim, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/685,027

(22) Filed: Jan. 11, 2010

(65) Prior Publication Data

US 2010/0112766 A1 May 6, 2010

Related U.S. Application Data

(62) Division of application No. 11/672,599, filed on Feb. 8, 2007, now Pat. No. 7,714,358.

(51) Int. Cl.
*H01L 21/8234* (2006.01)
(52) U.S. Cl. .......... 438/232; 438/514; 438/299
(58) Field of Classification Search .......... 257/347, 257/408, 335, 336; 438/153, 154, 514, 306
See application file for complete search history.

(56) References Cited

U.S. PATENT DOCUMENTS

| | | | |
|---|---|---|---|
| 4,597,824 A * | 7/1986 | Shinada et al. | 438/305 |
| 5,866,473 A | 2/1999 | Xiang et al. | |
| 6,277,698 B1 * | 8/2001 | Ishida et al. | 438/299 |
| 6,885,084 B2 | 4/2005 | Murthy et al. | |
| 7,023,018 B2 * | 4/2006 | Buss | 257/63 |
| 7,122,435 B2 | 10/2006 | Chidambaram et al. | |
| 7,384,851 B2 | 6/2008 | Ieong et al. | |
| 2005/0184311 A1 | 8/2005 | Murthy et al. | |
| 2006/0024876 A1 | 2/2006 | Chidambaram et al. | |
| 2006/0134872 A1 | 6/2006 | Hattendorf et al. | |
| 2007/0148888 A1 * | 6/2007 | Krull et al. | 438/306 |
| 2007/0254461 A1 * | 11/2007 | Wei et al. | 438/514 |
| 2008/0090350 A1 * | 4/2008 | Yan et al. | 438/257 |

OTHER PUBLICATIONS

Liu et al., U.S. Appl. No. 11/672,599, Office Action Communication, Dec. 9, 2008, 7 pages.
Liu et al., U.S. Appl. No. 11/672,599, Office Action Communication, Feb. 26, 2009, 12 pages.
Liu et al., U.S. Appl. No. 11/672,599, Office Action Communication, Aug. 5, 2009, 12 pages.
Liu et al., U.S. Appl. No. 11/672,599, Notice of Allowance, Dec. 22, 2009, 4 pages.

* cited by examiner

*Primary Examiner* — Wai-Sing Louie
*Assistant Examiner* — Sue Tang
(74) *Attorney, Agent, or Firm* — Gibb I.P. Law Firm, LLC; Ian D. MacKinnon, Esq.

(57) ABSTRACT

Disclosed are embodiments of an n-FET structure with silicon carbon S/D regions completely contained inside amorphization regions and with a carbon-free gate electrode. Containing carbon within the amorphization regions, ensures that all of the carbon is substitutional following re-crystallization to maximize the tensile stress imparted on channel region. The gate stack is capped during carbon implantation so the risk of carbon entering the gate stack and degrading the conductivity of the gate polysilicon and/or damaging the gate oxide is essentially eliminated. Thus, the carbon implant regions can be formed deeper. Deeper S/D carbon implants which are completely amorphized and then re-crystallized provide greater tensile stress on the n-FET channel region to further optimize electron mobility. Additionally, the gate electrode is uncapped during the n-type dopant process, so the n-type dopant dose in the gate electrode can be at least great as the dose in the S/D regions.

19 Claims, 13 Drawing Sheets

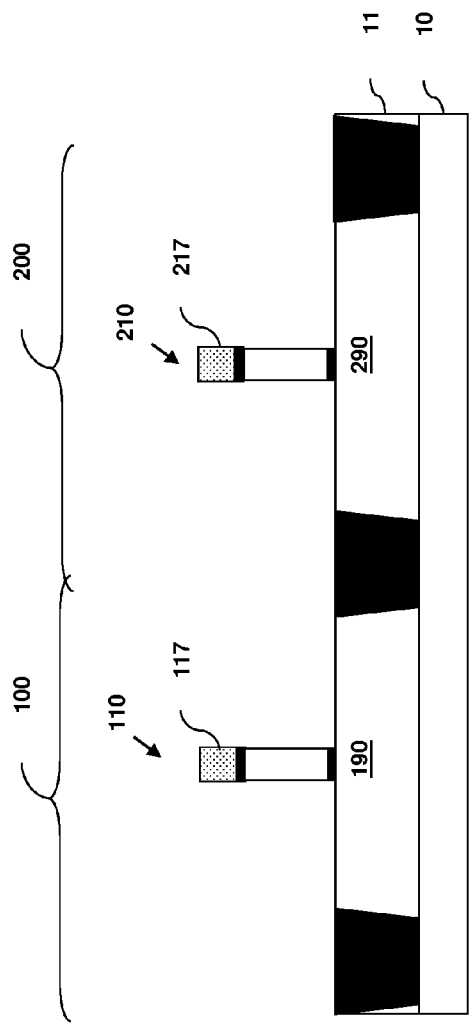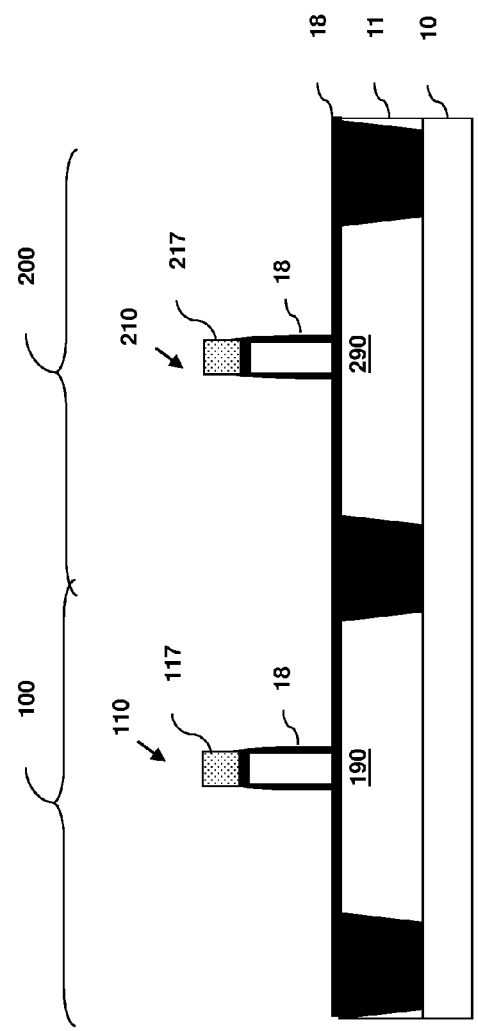

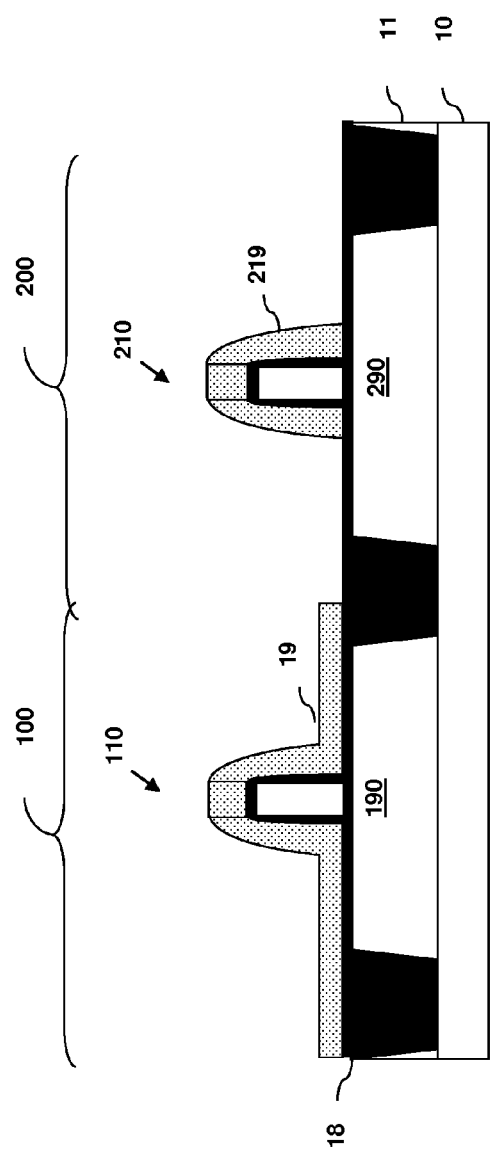
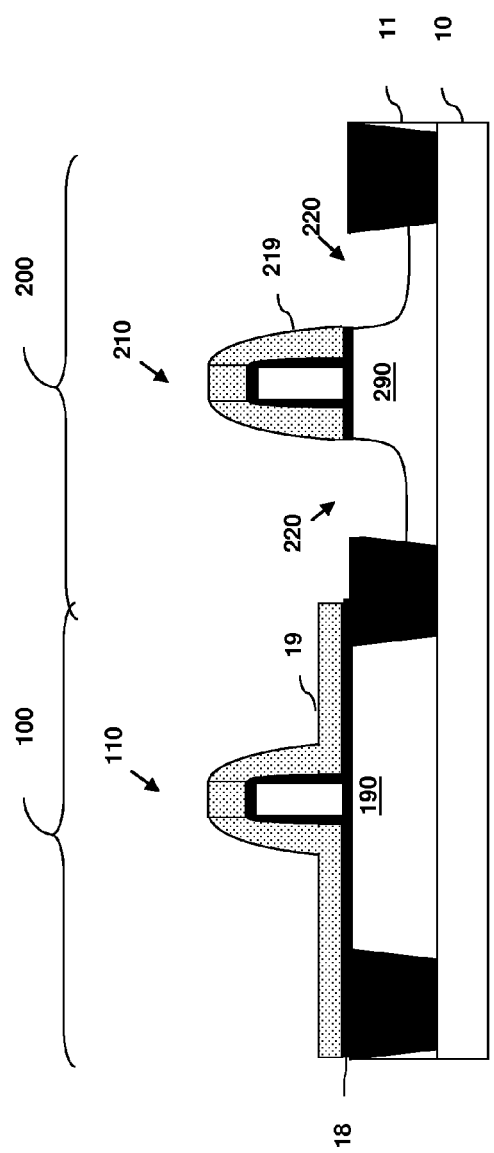

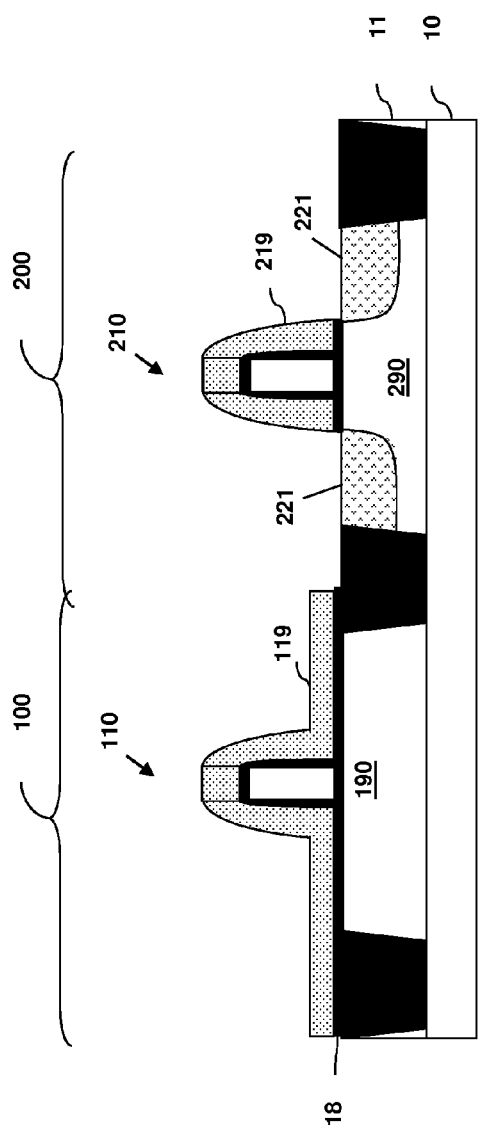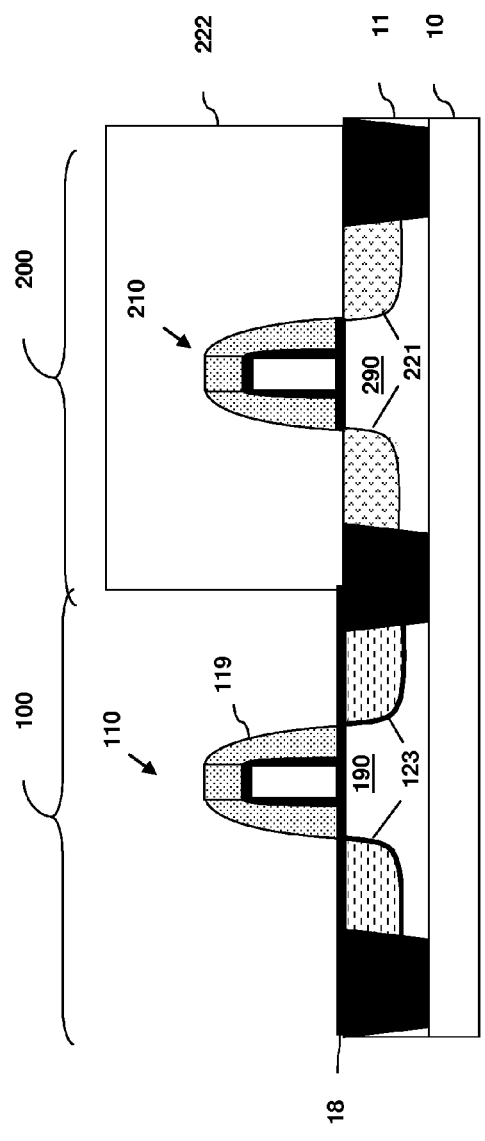

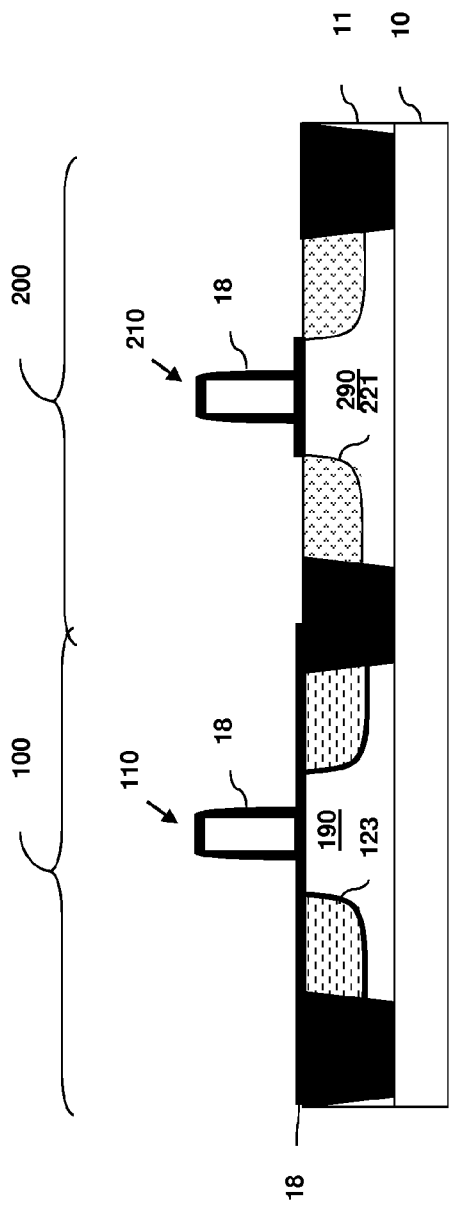
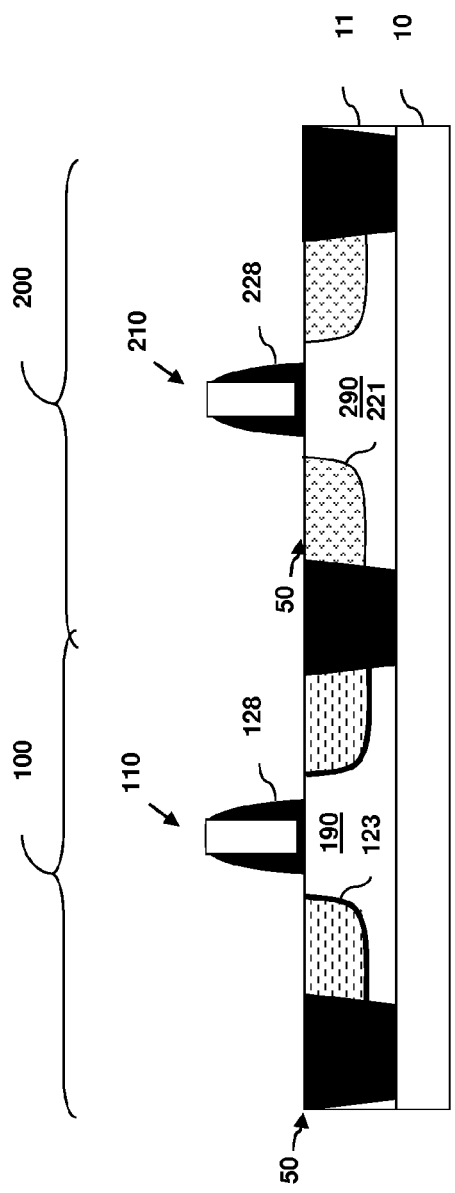

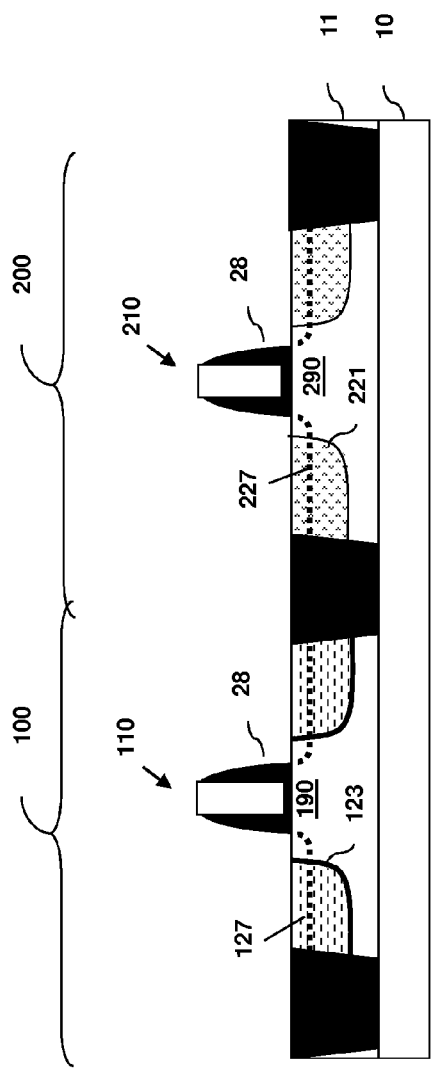
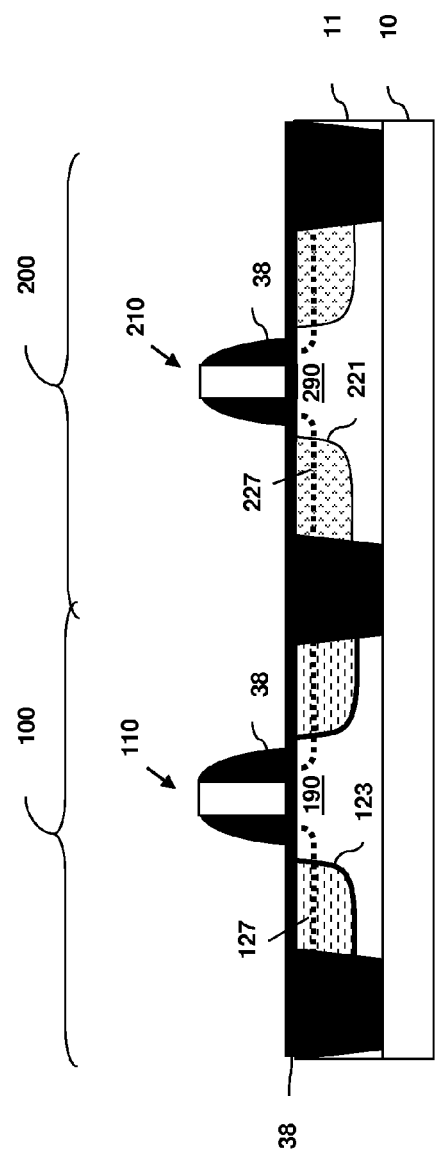

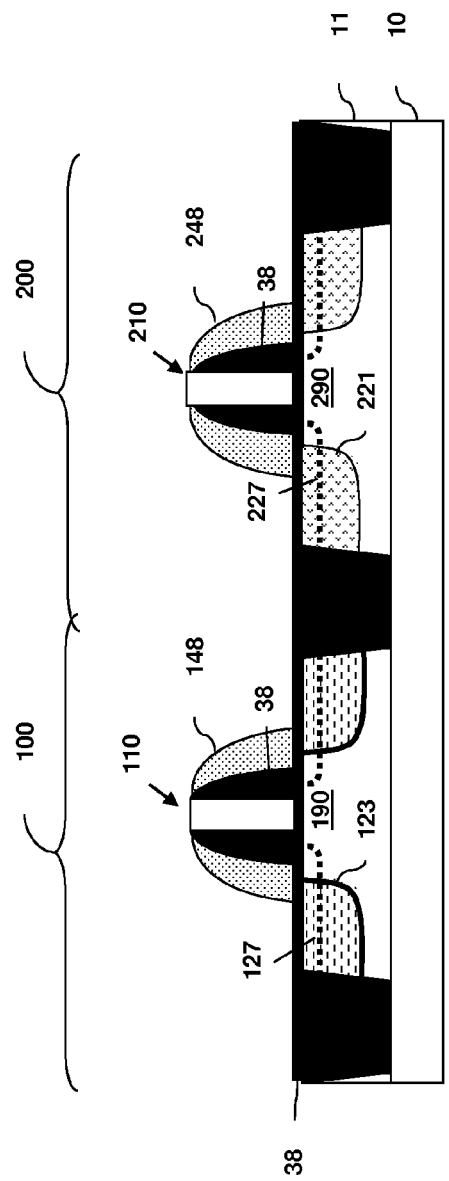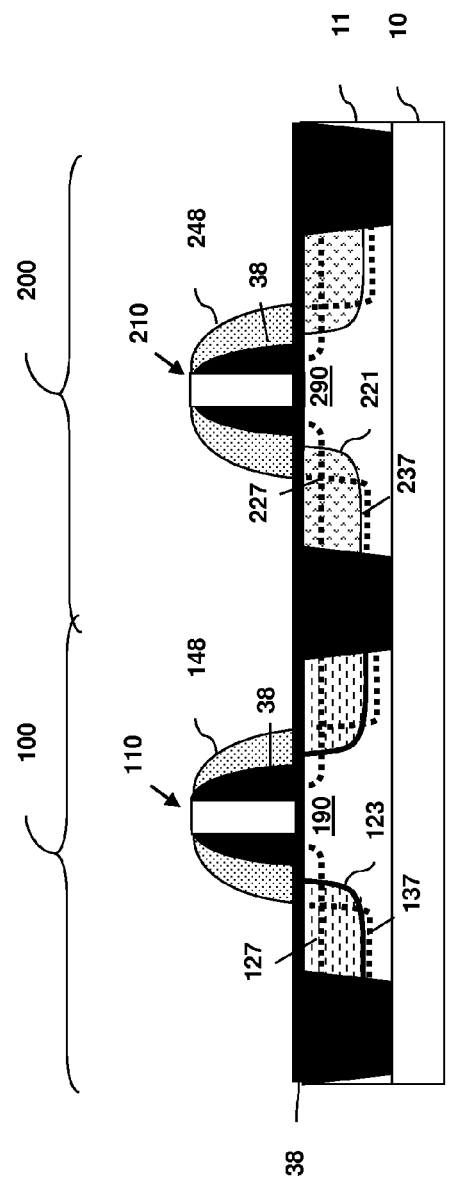
Figure 17
Figure 18

SEMICONDUCTOR STRUCTURE AND METHOD OF FORMING THE STRUCTURE

CROSS-REFERENCE TO RELATED APPLICATIONS

This application is a Continuation of U.S. application Ser. No. 11/672,599 filed Feb. 8, 2007, the complete disclosure of which, in its entirety, is herein incorporated by reference.

BACKGROUND

1. Field of the Invention

The embodiments of the invention generally relate to metal oxide semiconductor field effect transistors (MOSFETS) and, more particularly, to a strained MOSFET with carbon-doped source/drain regions and a method of forming the MOSFET.

2. Description of the Related Art

Current flowing through an electric field in the channel region of a field effect transistors is proportional to the mobility of the carriers (e.g., electrons in n-type field effect transistors (n-FETs) and holes in p-type field effect transistors (p-FETs) in that channel region. Different strains on the channel region can effect carrier mobility and, thus, current flow. For example, compressive stress on a channel region of a p-FET can enhance hole mobility. Contrarily, tensile stress on a channel region of an n-FET can enhance electron mobility. Various stress engineering techniques are known for imparting the desired stress on n-FET and p-FET channel regions. For example, as discussed in U.S. Pat. No. 6,885,084 of Murthy et al. issued on Apr. 26, 2005 and incorporated herein by reference, a compressive stress (i.e., a uni-axial compressive strain parallel to the direction of the current) can be created in the channel region of a p-FET by forming the source/drain regions with an alloy of silicon and germanium and a tensile stress (i.e., a uni-axial tensile strain parallel to the direction of the current) may be created in the channel region of an n-FET by forming the source/drain regions with an alloy of silicon and carbon.

One method of forming tensile stressor source/drain regions for n-FET performance enhancement is to amorphize source/drain regions with a carbon implant followed by re-crystallization of the implanted, amorphized source/drain regions. To maximize the stress effect of the re-crystallized silicon carbon source/drain regions, the carbon implant must be deep. Unfortunately, the deep carbon implant is limited because of the risk of simultaneously implanting carbon ions into the gate electrode and damaging the gate dielectric layer. Thus, there is a need in the art for an improved n-FET structure that provides optimum tensile stress to the channel region.

SUMMARY

In view of the foregoing, disclosed herein are embodiments of an improved n-type metal oxide semiconductor field effect transistor (n-FET) and of a complementary metal oxide semiconductor (CMOS) device that incorporates this n-FET. Also disclosed are embodiments of methods of forming both the n-FET individually and of forming the CMOS device that incorporates the n-FET.

Specifically, at an early stage in the n-FET formation process, a carbon implantation process is performed in order to form carbon implant regions on both sides of a channel region in a single crystalline silicon layer. During this carbon implantation process, the polysilicon gate electrode is protected by a nitride cap. After the carbon implantation process, the nitride cap is removed and n-type dopants are deposited for deep source/drain and source/drain extension formation. Following junction formation and a rapid thermal anneal process, an amorphization implantation process is preformed to re-amorphize the carbon implant regions in their entirety. Then, a laser anneal process is used to re-crystallize the silicon layer in the regions adjacent to the channel so as to form a silicon carbon alloy with the substitutional carbon and, thereby, to form uni-axial tensor stressors adjacent to the channel.

The method generates an n-FET structure with the silicon carbon completely contained inside the amorphization regions and with a carbon-free gate electrode. Contrary to prior art methods, the method disclosed herein decouples the carbon implantation and amorphization implantation processes, thereby providing more process flexibility. The method can also be combined with stress memorization techniques (SMT) to ensure optimal tensile stress. Additionally, when forming CMOS devices, the early stage carbon implantation process can be naturally integrated into an early epitaxial growth process for silicon germanium (eSiGe) source/drain regions for p-FETs.

More particularly, disclosed herein are embodiments of a semiconductor structure, such as a field effect transistor, that comprises a single crystalline silicon layer (e.g., a bulk silicon wafer, a silicon-on-insulator layer of a silicon-on-insulator (SOI) wafer, etc.), a channel region within the single crystalline silicon layer and a gate electrode above the channel region.

The semiconductor structure further comprises three implant regions symmetrically positioned on each side of the channel region. Specifically, on each side of the channel region, the single crystalline silicon layer of the semiconductor structure comprises a first implant region that comprises an amorphizing species (e.g., germanium (Ge), xenon (Xe), argon (Ar), silicon (Si), etc.), a second implant region that comprises a carbon and a third implant region, including a relatively deep source/drain (S/D) portion and a relatively shallow extension portion, that comprises an n-type dopant (e.g., phosphorous (P), arsenic (As) or antimony (Sb)).

The second implant region is contained within the first implant region such that the edge of the first implant region (i.e., the first edge) is outside the edge of the second implant region (i.e., the second edge) and is further between the edge of the second implant region and the channel region. Additionally, carbon is present in this second implant region such that, upon re-crystallization with an anneal process (e.g., a laser anneal, a flash anneal, a rapid thermal anneal, a furnace anneal, etc.), a silicon carbon alloy is formed in the second implant region. This silicon carbon alloy imparts a predetermined stress (e.g., a tensile stress) on the channel region and, thereby optimizes carrier mobility (i.e., electron mobility) and, thus, current flow, within the n-FET.

As mentioned above, the third implant region can comprise a relatively deep S/D portion and a relatively shallow S/D extension portion. The deep and shallow portions of this third implant region can overlap both the first and second implant regions. For example, as a result of the width of the spacers used during the S/D extension implantation process, the shallow S/D extension may extend horizontally closer to the channel region than either the first or second implant regions. Additionally, due to the S/D implant depth as well as S/D dopant diffusion, the deep portion of the third implant region may extend vertically below the first and second implant regions.

The semiconductor structure can further comprise a gate electrode above the channel region. This gate electrode can be doped with an n-type dopant. Due to a nitride cap layer used to protect the top surface of the gate electrode, during implantation of the dopant, the gate electrode is essentially free of the dopant. However, since this nitride cap layer is removed, prior to implanting the third implant region with the n-type dopant, the dose of the n-type dopant in the gate electrode will be no less than the dose of the n-type dopant in the deep S/D portion of the third implant region. Furthermore, if the polysilicon layer used to form the gate electrode during the transistor formation process is pre-doped with the n-type dopant, the dose of the n-type dopant in the gate electrode will be greater than the dose of the n-type dopant in the deep S/D portion of the third implant region.

This n-type transistor can be incorporated into a complementary metal oxide semiconductor (CMOS) device such that it is electrically coupled to an adjacent p-type metal oxide semiconductor field effect transistor (p-FET). As with the n-FET, the p-FET structure can be optimized for optimal carrier mobility (i.e., hole mobility) in its channel region. That is, to ensure optimal stress (i.e., compressive stress in the p-FET channel region), epitaxial silicon germanium regions can be grown in relatively deep recesses adjacent to the p-FET channel region. The p-FET channel region can further be disposed between two p-type dopant (e.g., boron (B)) implant regions. Each p-type dopant implant region (i.e., fourth implant region) can comprise both a relatively deep S/D portion and a relatively shallow S/D extension portion and can overlap an epitaxial silicon germanium region. For example, as a result of the varying spacer widths used during the recess formation process for the eSiGe regions and during the S/D extension implantation process, the shallow S/D extension portion of each fourth implant region may extend horizontally closer to the channel region than the eSiGe region. Additionally, due to the S/D implant depth as well as S/D dopant diffusion, the deep S/D portion of each fourth implant region may extend vertically below the eSiGe region.

Also disclosed are embodiments of a method of forming the above-described semiconductor device (e.g., the n-FET) as well as a complementary metal oxide semiconductor (CMOS) device that incorporates it.

An embodiment of the method of forming the semiconductor device comprises first providing a single crystalline silicon layer (e.g., a bulk silicon wafer, a silicon-on-insulator layer on an insulator layer of a silicon-on-insulator (SOI) wafer, etc.). Then, a gate stack (i.e., a gate dielectric layer-gate electrode layer stack, e.g., a gate oxide layer-gate polysilicon layer stack) with a nitride cap is formed above a designated channel region of the semiconductor.

Once the gate stack is formed, a first amorphization implant region, a second implant region and a third n-type dopant implant region are all formed in the single crystalline silicon layer on both sides of the designated channel region. The first implant region is implanted with an amorphizing species (e.g., germanium (Ge), xenon (Xe), argon (Ar), silicon (Si), etc.), the second implant region is implanted with a carbon, and the third implant region is implanted with an n-type dopant (e.g., phosphorous (P), arsenic (As) or antimony (Sb)).

On each side of the channel, these implant regions are formed such that the second implant region is contained within the first implant region and such that the third implant region overlaps both the first and second implant regions. Since the second implant region is contained within the first implant region, the amorphizing species of the first implant region amorphizes both the first implant region and the second implant region. Forming the first, second and third implant regions, as described above, can, for example, be accomplished by performing multi-step implantation processes using different gate electrode sidewall spacers having varying widths such that second implant regions are formed first, followed by the third implant regions, including the shallow S/D extensions and the deep S/Ds, and finally the first implant regions.

Optionally after the implant regions are formed, a stress layer (e.g., a nitride layer) can be formed (e.g., deposited) above the single crystalline silicon layer and the gate electrode of the n-FET. As discussed above, a tensile strain in the channel region increases electron mobility and decreases hole mobility. Thus, an appropriately selected straining layer (e.g., a nitride layer) can be formed over the n-FET. Then, during a subsequent anneal process, the strain of the straining layer will be 'memorized' in the silicon and polysilicon of the source/drain regions and gate, respectively. By inducing a tensile strain into the source/drain regions and into the gate, a similar strain is imparted on the channel region.

Next, an anneal process (e.g., a laser anneal, flash anneal, rapid thermal anneal, furnace anneal, etc.) is performed so as to re-crystallize the amorphized first implant region and, thus, to simultaneously re-crystallize the entire second implant region. Upon re-crystallization, the substitutional dopant present in the second implant region forms a silicon carbon alloy which imparts a predetermined stress (e.g., a tensile stress) on the channel region (i.e., the second implant region on each side of the channel becomes a uni-axial tensor stressor). These uni-axial tensor stressors enhance carrier mobility (i.e., electron mobility) within the n-FET channel region and, thus, optimize current flow. Additionally, as mentioned above, if the SMT layer is deposited, then during this laser anneal the strain of the straining layer will be 'memorized' in the single crystalline silicon layer on either side of the channel region and in the polysilicon gate electrode, thereby further enhancing the carrier mobility within the n-FET channel.

It should be noted that, when carbon is implanted forming the second implant region, the nitride cap protects the polysilicon gate electrode from carbon implantation. Thus, the polysilicon gate electrode remains carbon-free. Furthermore, this nitride cap can be removed after the carbon is implanted and prior to the implantation of the n-type dopant so that the n-type dopant is simultaneously implanted into the polysilicon gate electrode and the third implant region of the single crystalline silicon layer on either side of the polysilicon gate electrode. Additionally, since the nitride cap is removed prior to implanting the third implant region with the n-type dopant, the dose of the n-type dopant in the polysilicon gate electrode will be no less than the dose of the n-type dopant in the deep S/D portion of the third implant region. Furthermore, as the polysilicon gate electrode is being formed, the polysilicon material used to form the electrode can be pre-doped with the n-type dopant so that ultimately the dose of the n-type dopant in the polysilicon gate electrode will be greater than the dose of the n-type dopant in the deep S/D portion of the third implant region.

The above-described method embodiment for forming an n-FET can easily be incorporated into a method for forming a complementary metal oxide semiconductor (CMOS) device with both the n-FET and a simultaneously formed p-FET. To form such a CMOS device, multiple gate electrodes are patterned and formed above the designated channel regions for both n-FET(s) and p-FET(s). Nitride spacers formed on the sidewalls of the gate electrodes designate, for each n-FET, the location of the second implant regions relative to the polysilicon gate electrode and, for each p-FET, the location of the recesses, which are to be filled by epitaxial silicon germanium (eSiGe), relative to the gate electrode. Then, multi-step masked processes are used to implant the substitutional dopant into the n-FET(s) and to etch the recesses and epitaxially grow the silicon germanium for the p-FETs. P-FETs can also be masked during various subsequent processing steps to avoid implantation of the amorphizing species (e.g., germanium) and the n-type dopant (e.g., phosphorous (P), arsenic (As) and antimony (Sb)). Similarly, n-FETs can be masked during various subsequent processing steps to avoid implantation of the p-type dopant (e.g., boron (B)).

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which:

FIG. 7 is a schematic diagram illustrating a partially completed structure of the invention;

FIG. 8 is a schematic diagram illustrating a partially completed structure of the invention;

FIG. 9 is a schematic diagram illustrating a partially completed structure of the invention;

FIG. 10 is a schematic diagram illustrating a partially completed structure of the invention;

FIG. 11 is a schematic diagram illustrating a partially completed structure of the invention;

FIG. 12 is a schematic diagram illustrating a partially completed structure of the invention;

FIG. 13 is a schematic diagram illustrating a partially completed structure of the invention;

FIG. 14 is a schematic diagram illustrating a partially completed structure of the invention;

FIG. 15 is a schematic diagram illustrating a partially completed structure of the invention;

FIG. 16 is a schematic diagram illustrating a partially completed structure of the invention;

FIG. 17 is a schematic diagram illustrating a partially completed structure of the invention;

FIG. 18 is a schematic diagram illustrating a partially completed structure of the invention;

DETAILED DESCRIPTION OF PREFERRED EMBODIMENTS

Figure 1:
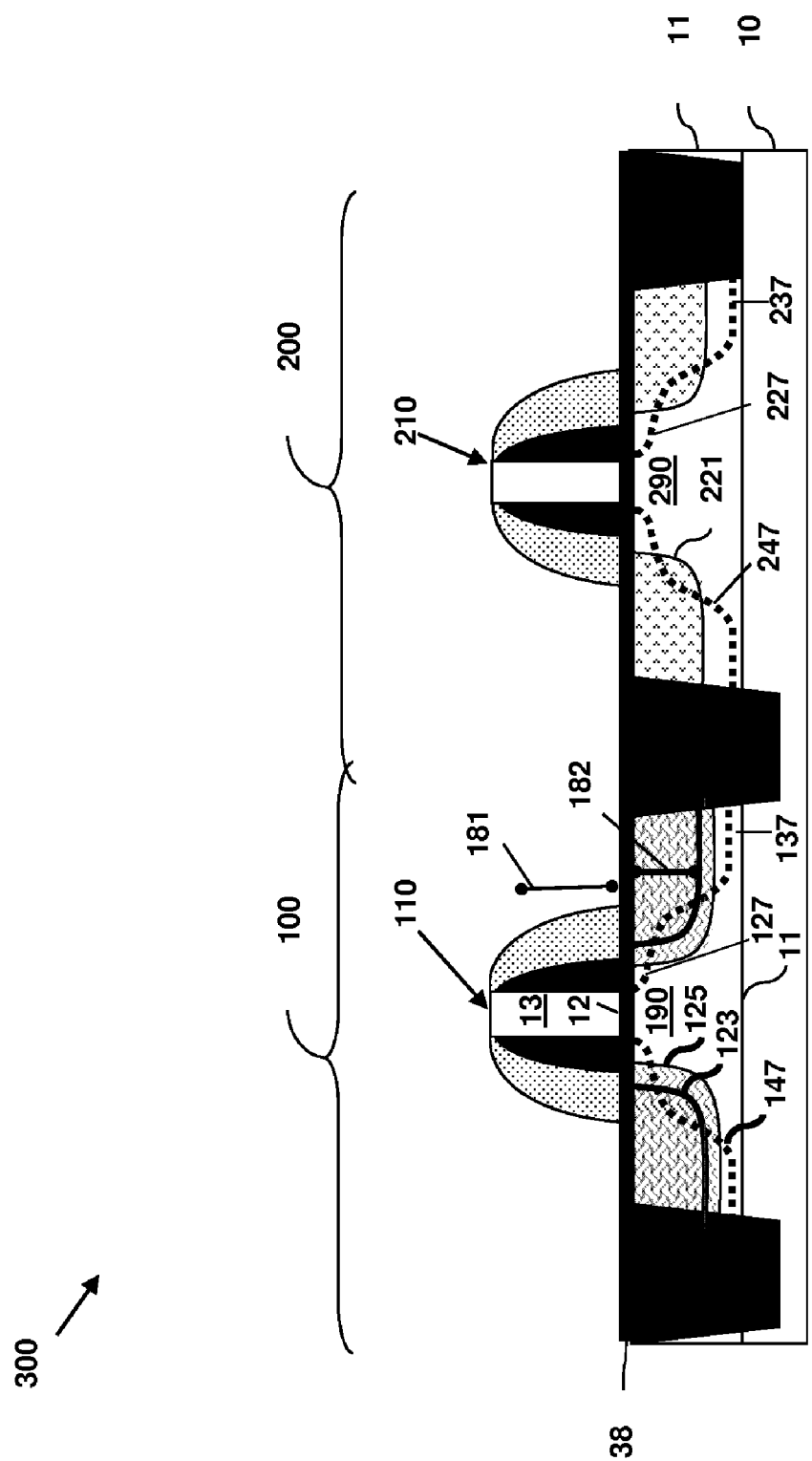
FIG. 1 is a schematic drawing illustrating embodiments of the structures 100 and 300 of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, various stress memorization techniques are know for imparting the desired stress on n-FET and p-FET channel regions. For example, as discussed in U.S. Pat. No. 6,885,084 of Murthy et al. issued on Apr. 26, 2005 and incorporated herein by reference, a compressive stress can be created in the channel region of a p-FET by forming the source/drain regions with an alloy of silicon and germanium and a tensile stress may be created in the channel region of an n-FET by forming the source/drain regions with an alloy of silicon and carbon.

One method of forming tensile stressor source/drain regions for n-FET performance enhancement is to amorphize source/drain regions with a carbon implant followed by re-crystallization of the implanted, amorphized source/drain regions. To maximize the stress effect of the re-crystallized silicon carbon source/drain regions, the carbon implant must be deep. Unfortunately, the depth of the carbon implant is limited because of the risk of simultaneously implanting carbon ions into the gate electrode and damaging the gate dielectric layer. One solution is to use a nitride cap layer on top of the polysilicon gate electrode during source/drain formation to prevent carbon atom implantation. However, since the amorphization and carbon implantation process are performed close to the end the front end of the line (FEOL) processing, the nitride cap must be kept on the polysilicon gate electrode through the junction formation implantation and anneal in order to avoid any high thermal budge after the re-crystallization of the silicon carbon source/drain regions. Keeping the nitride cap in place makes it difficult to properly dope the polysilicon gate. Thus, there is a need in the art for an improved n-FET structure that provides optimum tensile stress to the channel region without implanting carbon ions into the gate electrode and damaging the gate dielectric layer.

In view of the foregoing, disclosed herein are embodiments of an improved n-type metal oxide semiconductor field effect transistor (n-FET) and of a complementary metal oxide semiconductor (CMOS) device that incorporates this n-FET. Also disclosed are embodiments of methods of forming both the n-FET individually and of forming the CMOS device that incorporates the n-FET.

Specifically, at an early stage in the n-FET formation process, a carbon implantation process is performed in order to form carbon implant regions on both sides of a channel region in a single crystalline silicon layer. During this carbon implantation process, the polysilicon gate electrode is protected by a nitride cap. After the carbon implantation process, the nitride cap is removed and n-type dopants are deposited for deep source/drain and source/drain extension formation. Following junction formation and a rapid thermal anneal process, an amorphization implantation process is preformed to re-amorphize the carbon implant regions in their entirety. Then, a laser anneal process is used to re-crystallize the silicon layer in the regions adjacent to the channel so as to form a silicon carbon alloy with the substitutional carbon and, thereby, to form uni-axial tensile stressors adjacent to the channel.

The method generates an n-FET structure with the silicon carbon completely contained inside the amorphization regions and with a carbon-free gate electrode. Contrary to prior art methods, the method disclosed herein decouples the carbon implantation and amorphization implantation processes, thereby providing more process flexibility. The method can also be combined with stress memorization techniques (SMT) to ensure optimal tensile stress. Additionally, when forming CMOS devices, the early stage carbon implantation process can be naturally integrated into an early epitaxial growth process for silicon germanium (eSiGe) source/drain regions for p-FETs.

More particularly, referring to FIG. 1, disclosed herein are embodiments of a semiconductor structure 100 (e.g., an n-type metal oxide semiconductor field effect transistor (n-FET)) that comprises a single crystalline silicon layer 11 (e.g., a bulk silicon wafer, a silicon-on-insulator layer on an insulator layer 10 of a silicon-on-insulator (SOI) wafer, etc.), a channel region 190 within the single crystalline silicon layer 11 and a gate stack 110 (i.e., a gate dielectric layer 12-gate electrode layer 13 stack, e.g., a gate oxide layer-gate polysilicon layer stack) above the channel region 190.

The semiconductor structure 100 further comprises three implant regions 125, 123, 147 symmetrically positioned in the single crystalline silicon layer 11 on each side of the channel region 190. Specifically, on each side of the channel region 190, the single crystalline silicon layer 11 of the semiconductor structure comprises a first implant region 125 that comprises an amorphizing species (e.g., germanium (Ge), xenon (Xe), argon (Ar), silicon (Si), etc.), a second implant region 123 that comprises carbon and a third implant region 147, including a relatively deep source/drain (S/D) portion 137 and a relatively shallow S/D extension portion 127, that comprises an n-type dopant (e.g., phosphorous (P), arsenic (As) or antimony (Sb)).

The second implant region 123 is contained within the first implant region 125 such that the edge of the first implant region 125 (i.e., the first edge) is outside the edge of the second implant region 123 (i.e., the second edge) and is further between the edge of the second implant region 123 and the channel region 190. Additionally, the substitutional dopant is present in this second implant region 123 such that, upon re-crystallization with a laser anneal, a silicon carbon alloy is formed in the second implant region. This silicon carbon alloy imparts a predetermined stress (e.g., a tensile stress) on the channel region 190 and, thereby optimizes carrier mobility (i.e., electron mobility) and, thus, current flow, within the n-FET 100.

As mentioned above, the third implant region 147 can comprise a relatively deep S/D portion 137 and a relatively shallow S/D extension portion 127. The deep and shallow portions 127, 137 of this third implant region 147 can overlap both the first and second implant regions 123, 125 with the S/D extension 127 being closer to the channel region 190. For example, as a result of the width of the spacers used during the S/D extension 127 implantation process, the shallow S/D extension 127 may extend horizontally closer to the channel region 190 than either the first or second implant regions 123, 125. Additionally, due to the S/D implant depth as well as S/D dopant diffusion, the deep portion 137 of the third implant region 147 may extend vertically below the first and second implant regions 123, 125.

The semiconductor structure 100 can further comprise a gate stack 110 (i.e., a gate dielectric-gate electrode stack) above the channel region 190. The polysilicon gate electrode 13 of the gate stack 110 can be doped with an n-type dopant. Due to a sacrificial nitride cap layer used to protect the top surface of the gate stack 110 (and particularly the gate electrode 13), during implantation of carbon, the gate electrode 13 is carbon-free. However, since this nitride cap layer is removed, prior to implanting the third implant region 147, including the deep and shallow portions 127, 137, with the n-type dopant, the dose of the n-type dopant in the gate electrode 13 will be no less than the dose of the n-type dopant in the deep S/D portion 137 of the third implant region 147. Furthermore, if the polysilicon layer used to form the gate electrode 13 during the transistor 100 formation process is pre-doped with the n-type dopant, the dose of the n-type dopant in the gate electrode 13 will be greater than the dose of the n-type dopant in the deep S/D portion 137 of the third implant region 147.

Due to the method used to form this n-FET structure 100 with the silicon carbon completely contained inside the amorphization regions 125 and with an essentially carbon-free gate electrode 13, the carbon dopant implant regions 123 can extend deeper into the semiconductor 11 than in prior art n-FET structures without carbon damage to the gate oxide layer. For example, the carbon implant region 123 can now be deeper (see depth 182) than one-half the height 181 of the poly gate electrode 110. Deeper carbon implants regions 123 which are completely amorphized and then recrystallized provide greater tensile stress on the channel region 190 to further optimize electron mobility.

This n-type transistor 100 can be incorporated into a complementary metal oxide semiconductor (CMOS) device 300 such that it is electrically coupled to an adjacent p-type metal oxide semiconductor field effect transistor (p-FET) 200. As with the n-FET 100, the p-FET structure 200 can be optimized for optimal carrier mobility (i.e., hole mobility) in its channel region 290. That is, to ensure optimal stress (i.e., compressive stress in the p-FET channel region), epitaxial silicon germanium regions 221 can be grown in relatively deep recesses adjacent to the p-FET channel region 290. The p-FET channel region 290 can further be disposed between two p-type dopant implant regions 247. As with the n-type dopant implant regions of the n-FET, each p-type dopant (e.g., boron (B)) implant region 247 (i.e., fourth implant region) can comprise both a relatively deep S/D portion 237 and a relatively shallow S/D extension portion 227, which is closer to the channel region 290. This p-type dopant implant region 247 can overlap the epitaxial silicon germanium region 221. For example, as a result of the varying spacer widths used during the recess formation process for the eSiGe regions and during the S/D extension implantation process, the shallow S/D extension portion 227 of each fourth implant region 247 may extend horizontally closer to the channel region 290 than the eSiGe region 221. Additionally, due to the S/D implant depth as well as S/D dopant diffusion, the deep S/D portion 237 of each fourth implant region 247 may extend vertically below the eSiGe region 221.

Also disclosed are embodiments of a method of forming the above-described semiconductor device 100 (e.g., the n-FET) as well as a complementary metal oxide semiconductor (CMOS) device 300 that incorporates it.

Figure 2:
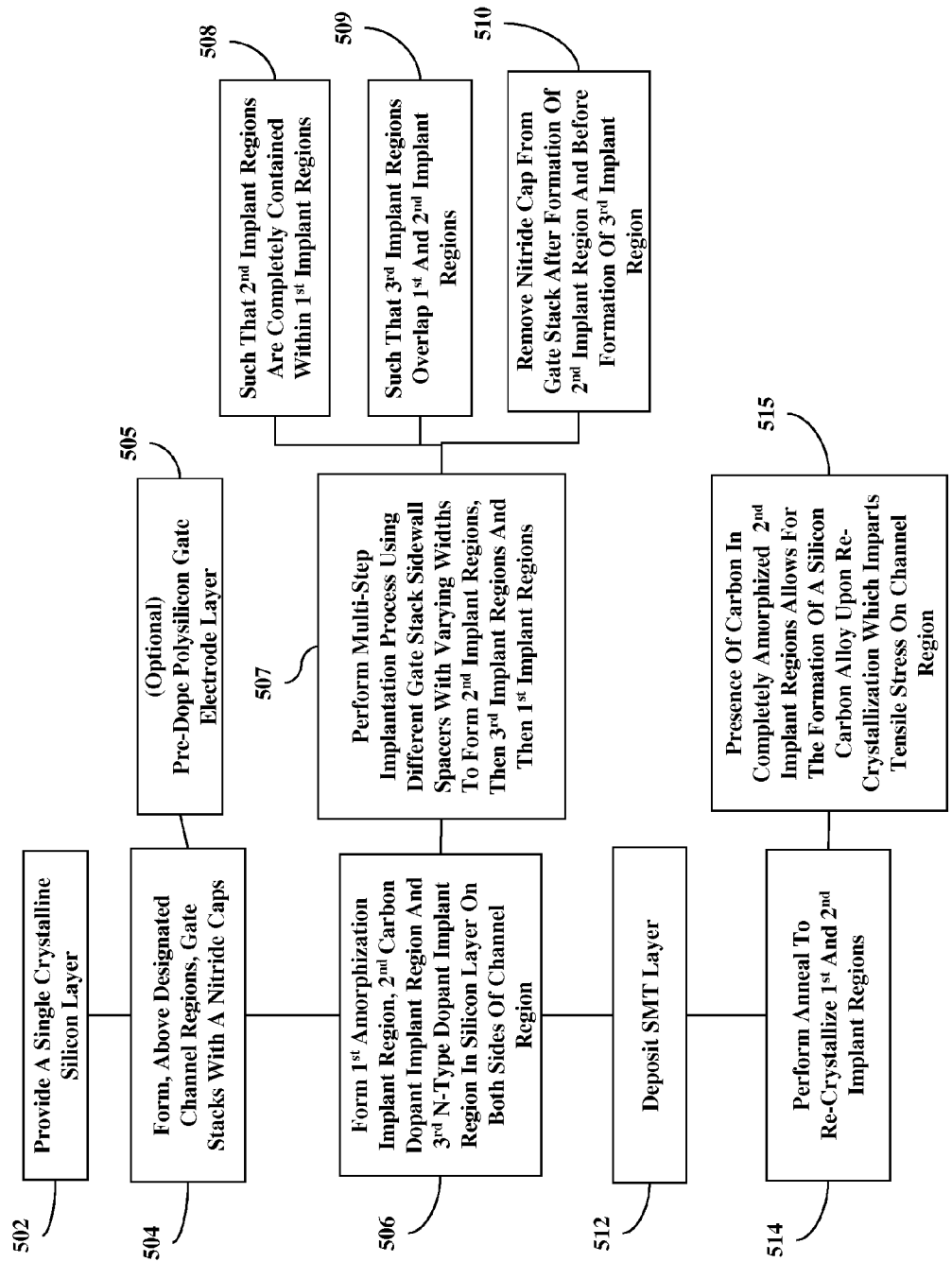
FIG. 2 is a flow diagram illustrating an embodiment of a method of the invention.

Referring to FIG. 2, an embodiment of the method of forming the semiconductor device 100 comprises first providing a single crystalline silicon layer (e.g., a bulk silicon wafer, a silicon-on-insulator layer of a silicon-on-insulator (SOI) wafer, etc.) (502). Then, a gate stack (i.e., a gate dielectric layer-gate electrode layer stack, e.g., a gate oxide layer-gate polyxilicon layer stack) with a nitride cap is formed above a designated channel region of the single crystalline silicon layer (504).

Once the gate stack is formed at process 504, a first amorphization implant region, a second carbon implant region and a third n-type dopant implant region are all formed in the single crystalline silicon layer on both sides of the designated channel region (506). The first implant region is implanted with an amorphizing species (e.g., germanium (Ge), xenon (Xe), argon (Ar), silicon (Si), etc.), the second implant region is implanted with carbon, and the third implant region is implanted with an n-type dopant (e.g., phosphorous (P), arsenic (As) or antimony (Sb)).

On each side of the channel, these implant regions are formed such that the second implant region is contained within the first implant region (508) and such that the third implant region overlaps both the first and second implant regions (509). Since the second implant region is contained within the first implant region, the amorphizing species of the first implant region amorphizes both the first implant region and the second implant region. Forming the first, second and third implant regions, as described above, can, for example, be accomplished by performing multi-step implantation processes using different gate electrode sidewall spacers having varying widths, wherein the second implant regions are formed first, followed by the third implant regions, including the shallow S/D extensions and the deep S/Ds, and finally the first implant regions (507).

Optionally after the implant regions are formed at process 506, a stress layer (e.g., a nitride layer) (referred to interchangeably in this specification as a stress layer, a stress memorization technique (SMT) layer, an SMT layer, an SMT straining layer and a straining layer) can be formed (e.g., deposited) above the single crystalline silicon layer on either side of the channel region and above the gate electrode of the n-FET (512). As discussed above, a tensile strain in the channel region increases electron mobility and decreases hole mobility. Thus, an appropriately selected straining layer (e.g., a nitride layer) can be formed over the n-FET. Then, during a subsequent anneal process (e.g., at process 514, discussed below), the strain of the straining layer will be 'memorized' in the silicon and polysilicon of the source/drain regions and gate, respectively. By inducing a tensile strain into the source/drain regions and into the gate, a similar strain is imparted on the channel region.

Next, an anneal process is performed (e.g., a laser anneal, a flash anneal, a rapid thermal anneal, a furnace anneal, etc.) so as to re-crystallize the amorphized first implant region and, thus, to simultaneously re-crystallize the entire second implant region (514). Upon re-crystallization, the carbon present in the second implant region forms a silicon carbon alloy which imparts a predetermined stress (e.g., a tensile stress) on the channel region (i.e., the second implant region on each side of the channel becomes a uni-axial tensor stressor) (515). These uni-axial tensile stressors enhance carrier mobility (i.e., electron mobility) within the n-FET channel region and, thus, optimize current flow. Additionally, as mentioned above, if the SMT straining layer is deposited at process 512, then during this laser anneal the strain of the SMT straining layer will be 'memorized' in the S/D regions of the single crystalline silicon layer on either side of the channel region and in the polysilicon gate electrode, thereby further enhancing the carrier mobility within the n-FET channel.

It should be noted that, when carbon is implanted into the second implant region at process 506, the nitride cap protects the polysilicon gate electrode layer of the gate stack from dopant implantation. Thus, the polysilicon gate electrode remains carbon-free. Furthermore, this nitride cap can be removed after the carbon is implanted and prior to the implantation of the n-type dopant so that the n-type dopant is simultaneously implanted into the polysilicon gate electrode layer of the gate stack and the third implant region of the single crystalline silicon layer on either side of the gate stack (510). Additionally, since the nitride cap is removed at process 510 prior to implanting the third implant region with the n-type dopant, the dose of the n-type dopant in the polysilicon gate electrode will be no less than the dose of the n-type dopant in the deep S/D portion of the third implant region. Furthermore, as the gate stack is being formed, the polysilicon material used to form the gate electrode layer can be pre-doped with the n-type dopant (505) so that ultimately the dose of the n-type dopant in the polysilicon gate electrode will be greater than the dose of the n-type dopant in the deep S/D portion of the third implant region.

The above-described method embodiment for forming an n-FET can easily be incorporated into a method for forming a complementary metal oxide semiconductor (CMOS) device with both the n-FET and a simultaneously formed p-FET. To form such a CMOS device, multiple gate electrodes are patterned and formed above the designated channel regions for both n-FET(s) and p-FET(s). Nitride spacers that are formed on the sidewalls of the gate stacks designate, for each n-FET, the location of the second implant regions relative to the polysilicon gate electrode and, for each p-FET, the location of the recesses, which are to be filled by epitaxial silicon germanium (eSiGe), relative to the gate electrode. Then, multi-step masked processes are used to implant the substitutional dopant into the n-FET(s) and to etch the recesses and eptiaxially grow the silicon germanium for the p-FETs. P-FETs can also be masked during various subsequent processing steps to avoid implantation of the amorphizing dopant (e.g., germanium) and the n-type dopant (e.g., phosphorous (P), arsenic (As) and antimony (Sb)). Similarly, n-FETs can be masked during various subsequent processing steps to avoid implantation of the p-type dopant (e.g., boron (B)).

Figure 3:
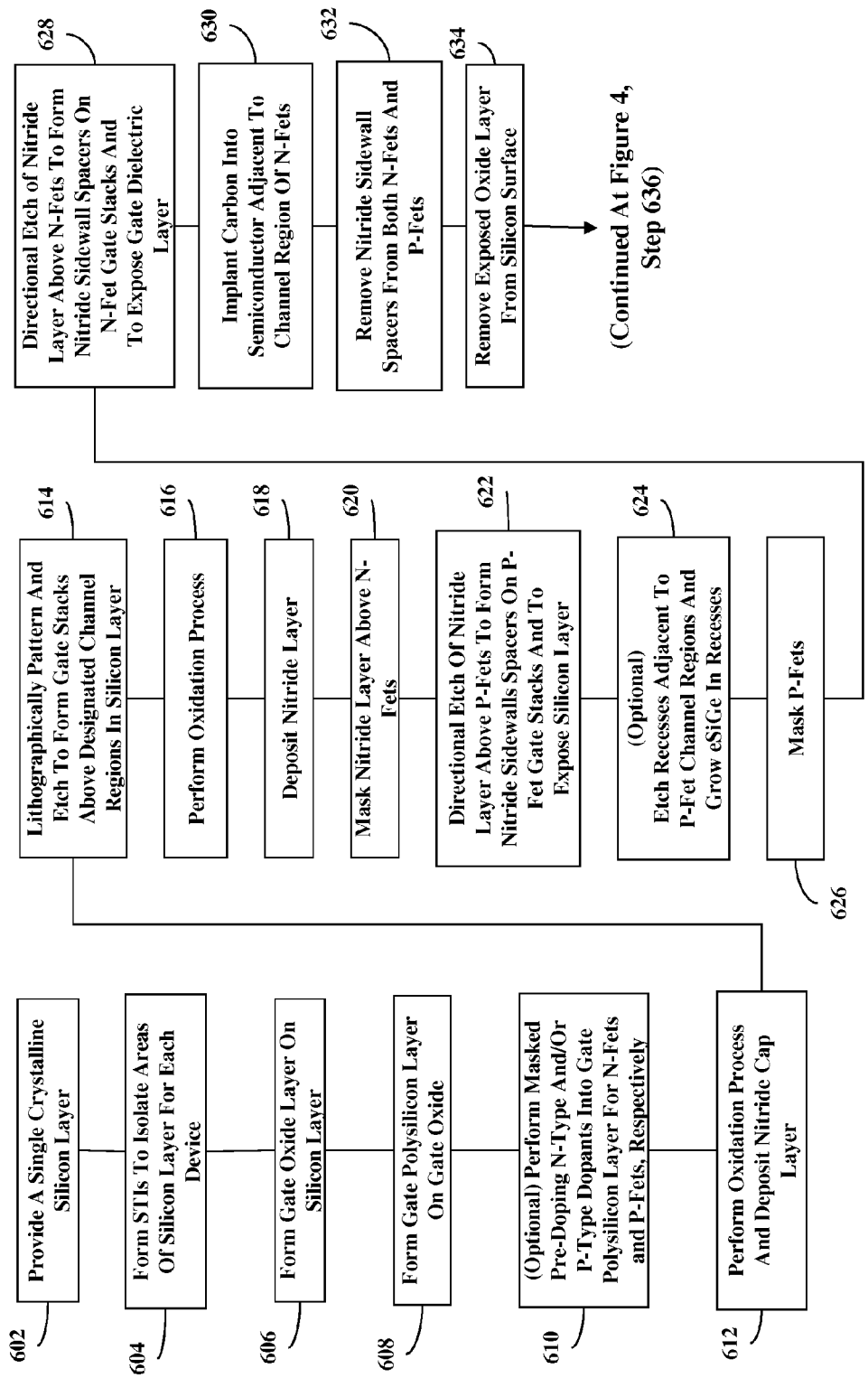
FIG. 3 is a flow diagram illustrating steps 602-634 of an embodiment of a method of the invention.
Figure 4:
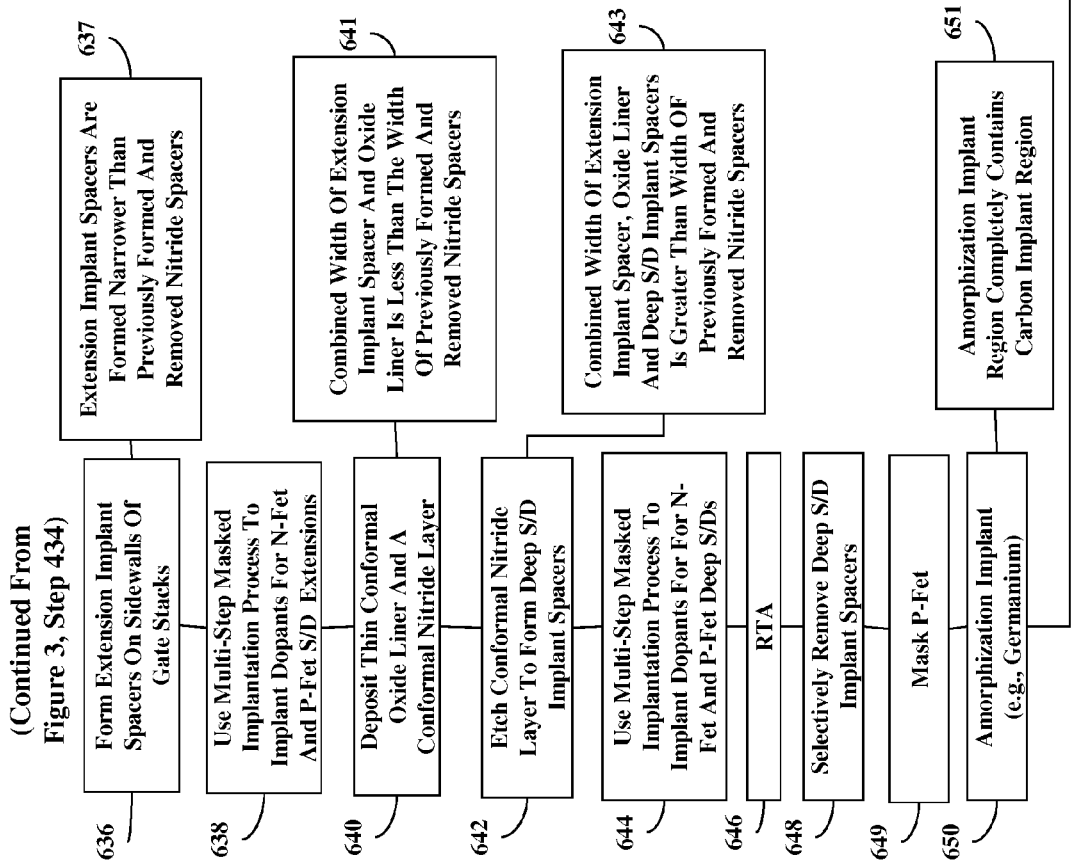
FIG. 4 is a continued flow diagram illustrating steps 636-658 of an embodiment of a method of the invention.

More specifically, FIGS. 3-4 illustrate an exemplary method embodiment which integrates the above-described processing techniques discussed in FIG. 2 for forming the n-FET 100 of FIG. 1 with p-FET 200 processing techniques.

Figure 5:
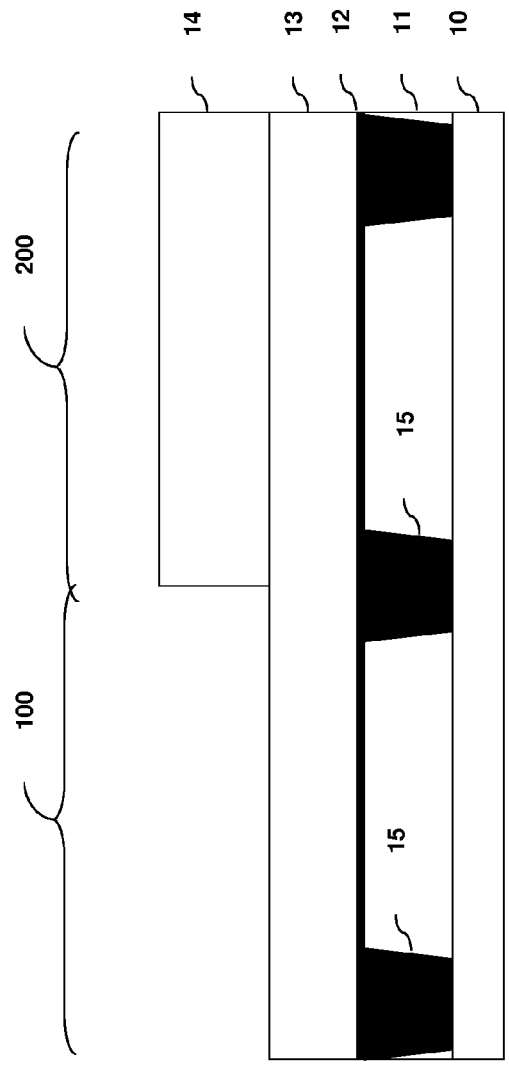
FIG. 5 is a schematic diagram illustrating a partially completed structure of the invention.

In this exemplary method embodiment a single crystalline silicon layer 11 (e.g., a bulk silicon wafer, a silicon-on-insulator layer of a silicon-on-insulator (SOI) wafer, etc.) is provided (402, see FIG. 5). Then, using conventional processing techniques, shallow trench isolation structures 15 are formed (e.g., patterned, etched and filled with a dielectric) in the single crystalline silicon layer 11 to isolate areas in the single crystalline silicon layer 11 for each device (e.g., for each n-FET 100 and each p-FET 200).

Next, a gate dielectric layer (e.g., a thin gate oxide layer) 12 is deposited over the single crystalline silicon layer 11 and STIs 15 (606, see FIG. 5). Then, gate polysilicon layer 13 is deposited (608, see FIG. 5).

Optionally, the p-FET area can be masked, using conventional processing techniques (e.g., deposition and lithographic patterning of a photo-resist layer 14), and the exposed portion of the gate polysilicon layer 13 in the n-FET area can be pre-doped with an n-type dopant (e.g., phosphorous (P), arsenic (As) and antimony (Sb)) (610, see FIG. 5)

Figure 6:
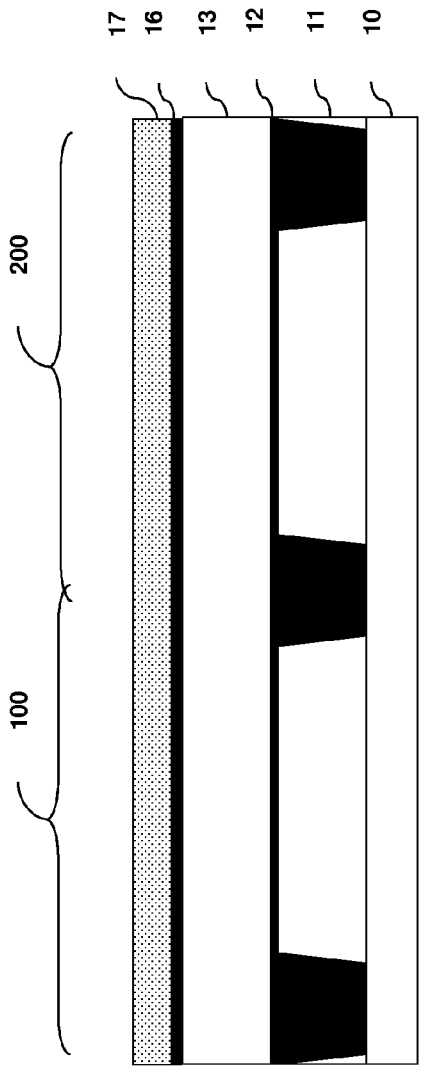
FIG. 6 is a schematic diagram illustrating a partially completed structure of the invention.

Then, the mask 14 can be removed and an oxidation process can be performed in order to form a thin oxide layer 16 on the gate polysilicon layer 13. After the oxidation process is performed a nitride cap layer 17 can be deposited on the thin oxide layer 16 (612, see FIG. 6).

After the nitride cap layer 17 is formed at process 612, gate stacks 110, 210 can be formed for each FET 100, 200, using conventional processing techniques (614, see FIG. 7). For example, a photo-resist layer can be deposited and lithographically patterned. Then, selective reactive ion etch (RIE) processes can be performed to etch through the nitride 17, oxide 16, gate polysilicon 13 and gate oxide 12 layers so as to form gate stacks 110, 210 with nitride caps 117, 217 above the designated channel regions 190, 290 for the n-FETs and p-FETs 100, 200, respectively.

After the gate stacks 110, 210 are formed at process 614, another oxidation process can be performed so as to form a thin oxide layer 18 on the exposed single crystalline silicon layer 11 and exposed polysilicon sidewalls of the gate stacks 110, 210 (616), see FIG. 8). Next, a nitride layer 19 can be deposited and masked above the n-FET, using conventional processing techniques (618-620). Then, the nitride layer 19 above the p-FET can be directionally etched (e.g., using a reactive ion etch (RIE) process) so as to form nitride spacers 219 on the sidewalls of the gate stack 210 and to remove the portion of the nitride layer 19 from the top surface of the oxide layer 18 not protected by the mask (622, see FIG. 9). The exposed oxide layer 18 between the nitride sidewall spacers 219 and the STIs 15 are then removed (e.g., selectively etched).

After the portion of the single crystalline silicon layer 11 between the nitride sidewall spacers 219 and STIs 15 is exposed, another directional etch process is performed so as to form recesses 220 in the single crystalline silicon layer 11 adjacent to the channel region 290 of the p-FET 200. Once the recesses 220 are formed, they can be filled with silicon germanium, for example, using an epitaxial growth process (624, see FIGS. 10-11). Thus, silicon germanium regions 221 are formed on both sides of the channel region 290 of the p-FET 200. As mentioned above, optimal carrier mobility (i.e., hole mobility) in the p-FET channel region 290 can be achieved by imparting a uni-axial compressive stress on the p-FET channel region using epitaxial silicon germanium (eSiGe) in the S/D regions.

After the eSiGe regions 221 are formed for the p-FET 200 at process 624, the p-FET 200 can be covered with a mask 222 (e.g., using conventional processing techniques) such that the n-FET 100 is exposed (626, see FIG. 12).

Next, the nitride layer 19 above the n-FET can be directionally etched (e.g., using a reactive ion etch (RIE) process) in order to form nitride spacers 119 on the sidewalls of the n-FET gate stack 110 (628, see FIG. 12). The predetermined width of these spacers 119 will determine the location, relative to the gate stack 110 and channel region 190, of the carbon implant region 123 (e.g., the carbon dopant implant region which was referred to in the above discussion of the n-FET structure 100 as the second implant region). Once the nitride spacers 119 are formed, carbon is implanted into the single crystalline silicon layer 11 on either side of the spacers 119 (630, see FIG. 12). Carbon is specifically selected so that when the single crystalline silicon layer 11 adjacent to the gate stack 110 is subsequently amorphized and then recrystallized with carbon it will impart a tensile stress on the channel region 190.

After the carbon implant regions 123 (i.e., the second implant regions) are formed at process 630, the mask 222 over the p-FET 200 is removed and the nitride sidewall spacers 119, 219 are removed (e.g., with hot phosphorus) from the gate stacks 110, 210 (632, see FIG. 13). Thus, the remaining portion of the oxide layer 18 on the p-FET gate stack 210, the n-FET gate stack 110 and above the single crystalline silicon layer 11 of the n-FET and p-FET is exposed (see FIG. 13).

Next, a thin conformal oxide layer is formed (e.g, by low temperature oxide (LTO) deposition) and then directionally etched (e.g., using a reactive ion etch (RIE) process) to form oxide S/D extension spacers 128 adjacent to the sidewalls of the n-FET gate stack 110, to form oxide S/D extension implant spacers 228 adjacent to the sidewalls of the p-FET gate stack 210 and to remove any oxide material from the surface 50 (636, see FIG. 14). The width of these S/D extension implant spacers 128, 228 can be predetermined so as to set the distance between the S/D extensions and the respective gate stacks 110, 210 and specifically can be narrower than the nitride spacers 119 that were used when implanting carbon in the second implant region 123 (637). Then, a multi-step masked implantation process can be used to form n-doped shallow S/D extensions 127 for the n-FET 100 and p-doped shallow S/D extensions 227 for the p-FET 200 (638, see FIG. 15).

Then, a thin conformal oxide liner 38 can be deposited (e.g., by low temperature oxide (LTO) deposition (640). The thickness of the oxide liner 38 should be such that combined width of the oxide liner and a S/D extension implant spacer on either side of a gate stack is also less than the width of the nitride spacers 119 that were used when implanting carbon in the second implant region 123 (641).

Oxide liner deposition is followed by the deposition of an additional nitride layer that is directionally etched (e.g., using a reactive ion etching (RIE) process) to form nitride deep S/D implant spacers 148, 248 adjacent to the gate stacks 110, 210, respectively. The width of these deep S/D implant spacers 148, 248 can be predetermined so as to set the distance between the subsequently implanted deep S/Ds 137, 237 and the gate stacks 110, 210, respectively. Specifically, for the n-FET and p-FET, the combined width of the deep S/D implant spacer, the oxide liner, and the S/D extension implant spacer on either side of the gate stack 110, 210 should be greater than the width of the nitride spacers 119 that were used when implanting the substitutional dopant (e.g., carbon) in the second implant region 123 and greater than the width of the nitride spacers 219 that were used when forming the eSiGe regions 121 (643, see FIG. 17).

Next, a multi-step masked implantation process can be used to form n-doped deep S/Ds 137 for the n-FET 100 and p-doped deep S/Ds 237 for the p-FET 200 (644, see FIG. 18).

Figure 19:
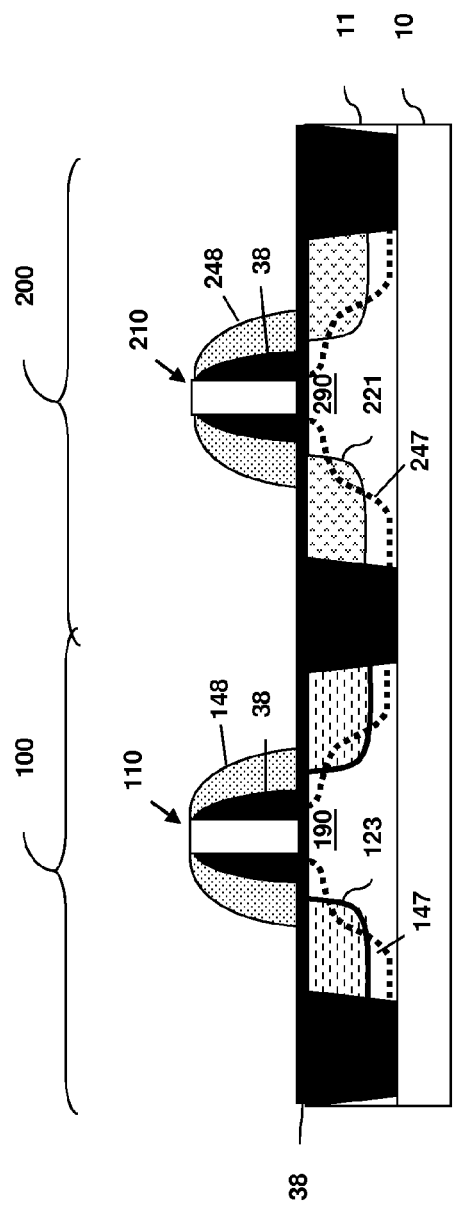
FIG. 19 is a schematic diagram illustrating a partially completed structure of the invention.

After the deep S/Ds 137, 237 are formed, a rapid thermal anneal process can be performed to activate and diffuse the dopants (646, see FIG. 19), thus forming the n-doped implant regions 147 in the n-FET (i.e., the third implant region discussed above with regard to n-FET structure 100 of FIG. 1) and the p-doped implant region 247 in the p-FET (i.e., the fourth implant region discussed above with regard to the p-FET structure 200 in the CMOS device 300 of FIG. 1).

Figure 20:
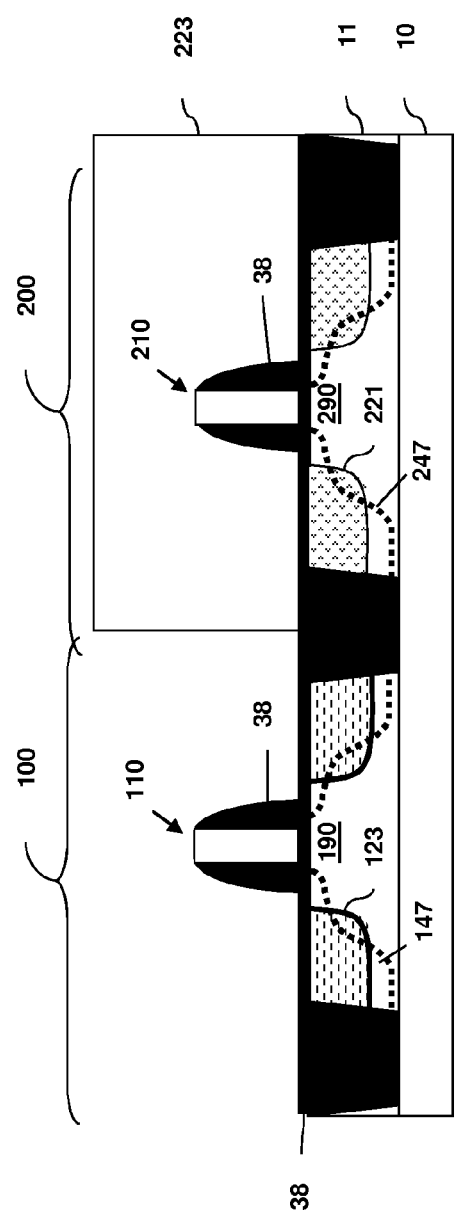
FIG. 20 is a schematic diagram illustrating a partially completed structure of the invention.
Figure 21:
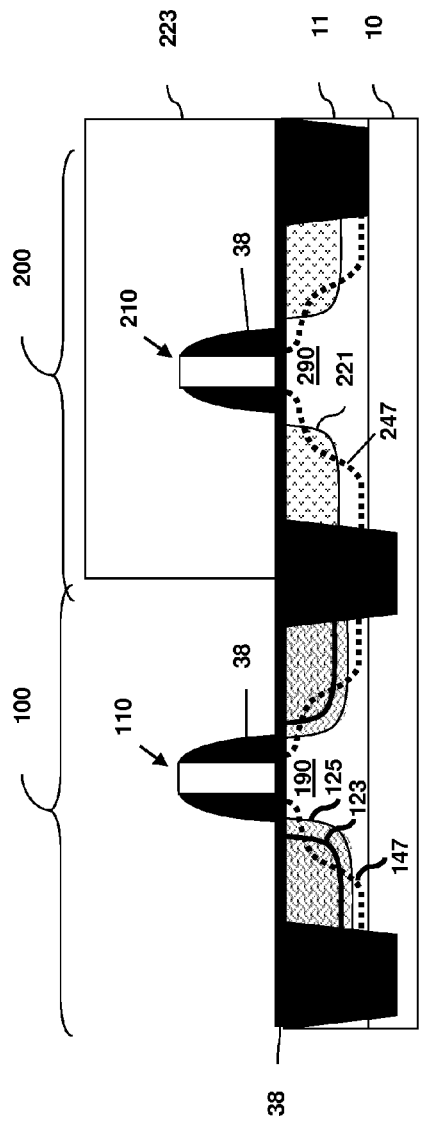
FIG. 21 is a schematic diagram illustrating a partially completed structure of the invention.

The nitride deep S/D implant spacers 148, 248 are then selectively removed, exposing the oxide conformal layer 38 (648). Then, a mask 223 is formed over the p-FET, using conventional processing techniques over the p-FET (648-649, see FIG. 20). Next, an amorphizing species (e.g., germanium (Ge), xenon (Xe), argon (Ar), silicon (Si), etc.) is implanted into the single crystalline silicon layer 11 so as to form the amorphization implant region 125 (i.e., the first implant region 125 discussed above with regard to the n-FET structure 100 of FIG. 1) (650, see FIG. 21). The amorphizing species can be implanted deeper into the single crystalline silicon layer 11 than the carbon implanted into region 123. Additionally, as discussed at process 641, the combined width of the oxide liner 38 and a S/D extension implant spacer 128 on either side of a gate stack 110 is also less than the width of the nitride spacers 119 that were used when implanting carbon in the second implant region 123. Thus, the second implant region 123 is contained entirely within the first implant region 125 such that the edge of the first implant region 125 (i.e., the first edge) is outside the edge of the second implant region 123 (i.e., the second edge) and is further between the edge of the second implant region 123 and the channel region 190. Consequently, the entire carbon implant region 123 of the silicon layer 11 is amorphized at process 650 (651).

Figure 22:
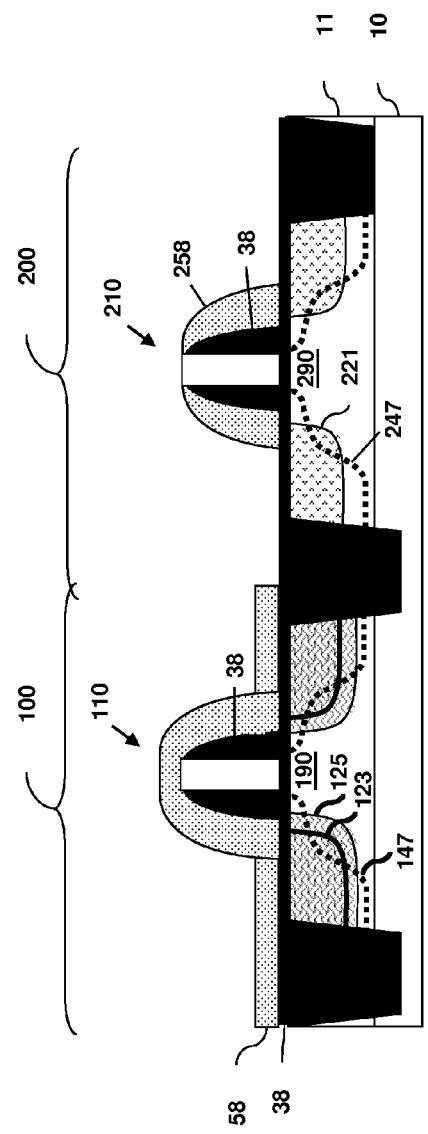
FIG. 22 is a schematic diagram illustrating a partially completed structure of the invention.

Optionally, after the amorphization implant process 650 is completed, an additional thin oxide liner can be deposited (e.g., by low temperature oxide deposition) (652). A stress memorization technique (SMT) layer 58 (e.g., a nitride layer) (referred to interchangeably in this specification as a stress layer, a stress memorization technique (SMT) layer, an SMT layer, an SMT straining layer and a straining layer) can also optionally be deposited (654). This SMT layer 58 can then be lithographically patterned and etched (e.g., using a reactive ion etch (RIE) process) such that the SMT layer 58 remains over the entire n-FET but only nitride gate electric sidewall spacers 258 remain on the p-FET (654, see FIG. 22). As discussed above, a tensile strain in the channel region 190 of an n-FET 100 will increase electron mobility and decreases hole mobility. Following a subsequent re-crystallization anneal (see process 656 below), an appropriately selected straining layer 58 (e.g., a nitride layer) formed over an n-FET will impart its strain on the silicon and polysilicon of the source/drain regions and gate stack, respectively. By inducing a tensile strain into the source/drain regions and into the gate of an n-FET, a similar strain is imparted on the channel region.

Following the optional SMT layer 58 formation at process 654, a laser anneal process is performed so as to re-crystallize the amorphized first implant region 125 and, thus, to simultaneously re-crystallize the entire second implant region 123 (656). Upon re-crystallization, the carbon present in the second implant region 123 forms a silicon carbon alloy which imparts the desired stress (e.g., a tensile stress) on the channel region 190 (i.e., the second implant region 123 on each side of the channel 190 becomes a uni-axial tensor stressor). These uni-axial tensor stressors enhance carrier mobility (i.e., electron mobility) within the n-FET channel region 190 and, thus, optimize current flow. Additionally, as mentioned above at process 654, if an SMT straining layer 58 is formed, then during this laser anneal the strain of the SMT straining layer 58 will be 'memorized' in the recrystallized regions (i.e., in the first and second implant regions 123, 125) and in the polysilicon layer 13 of the gate stack 110, thereby further enhancing the carrier mobility within the n-FET channel 190.

Following this laser anneal process 656, conventional middle of the line (MOL) and back end of the line (BEOL) CMOS processing (e.g., dielectric deposition, contact formation, etc.) can be performed in order to compete the CMOS structure 300.

Therefore, disclosed above are embodiments of an improved n-type metal oxide semiconductor field effect transistor (n-FET) and of a complementary metal oxide semiconductor (CMOS) device that incorporates this n-FET. Also disclosed are embodiments of methods of forming both the n-FET individually and of forming the CMOS device that incorporates the n-FET. Specifically, at an early stage in the n-FET formation process, a carbon implantation process is performed in order to form carbon implant regions on both sides of a channel region in a single crystalline silicon layer. During this carbon implantation process, the polysilicon gate electrode layer of the gate stack is protected by a nitride cap. After the carbon implantation process, the nitride cap is removed and n-type dopants are deposited for deep source/drain and source/drain extension formation. Following junction formation and a rapid thermal anneal process, an amorphization implantation process is preformed to re-amorphize the carbon implant regions in their entirety. Then, an anneal (e.g., a laser anneal, a flash anneal, a rapid thermal anneal, or a furnace anneal) process is used to re-crystallize the silicon layer in the regions adjacent to the channel so as to form a silicon carbon alloy with the substitutional carbon and, thereby, to form uni-axial tensor stressors adjacent to the channel.

Referring again to FIG. 1, the disclosed method embodiments generate an n-FET structure 100 with the silicon carbon S/D regions 123 completely contained inside amorphization regions 125 and with a carbon-free gate electrode 110. Containing carbon dopants completely within the amorphization regions 125 ensures that all of the carbon is substitutional following re-crystallization and, thus, maximizes the tensile stress imparted on the n-FET channel region 190. Since the gate stack 110 is capped with nitride during the carbon implant process, the risk of carbon entering the gate stack 110 and degrading the conductivity of the gate polysilicon 13 and/or damaging the gate oxide 12 is essentially eliminated. Thus, the carbon implant regions 123 can be formed deeper. For example, the carbon implant regions 123 can now be deeper (see depth 182) than one-half the height 181 of the gate stack 110. Deeper carbon implants which are completely amorphized and then re-crystallized provide greater tensile stress on the n-FET channel region 190 to further optimize electron mobility. Additionally, since the gate stack 110 is uncapped during the n-type dopant process, the n-type dopant dose in the polysilicon gate electrode 13 can be at least great as the n-type dopant dose in the deep source/drain regions 137.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, those skilled in the art will recognize that the embodiments of the invention can be practiced with modification within the spirit and scope of the appended claims.

What is claimed is:

1. A method of forming a semiconductor device, said method comprising:
providing a single crystalline silicon layer having a top surface and a bottom surface opposite said top surface;
forming a trench isolation region in said single crystalline silicon layer;
forming a gate stack on said top surface of said single crystalline silicon layer so as to designate a channel region in said single crystalline silicon layer;

performing multiple implantation processes so as to form a first implant region, a second implant region, and a third implant region in said single crystalline silicon layer between said channel region and said trench isolation region, said multiple implantation processes being performed such that said first implant region extends into said single crystalline silicon layer from a first point on said top surface, such that said first implant region is defined by a first edge that curves from said first point to said trench isolation region and such that said first implant region contains an amorphizing species from said top surface to said first edge, said multiple implantation processes further being performed such that said second implant region extends into said single crystalline silicon substrate from a second point on said top surface between said first point and said trench isolation region, such that said second implant region is defined by a second edge that curves from said second point to said trench isolation region and that is between said top surface and said first edge so that said second implant region is contained entirely within said first implant region and such that said second implant region contains carbon from said top surface to said second edge, and said multiple implantation processes further being performed such that said third implant region has a first portion adjacent to said channel region and a second portion, deeper than said first portion, between said first portion and said trench isolation region, such that third implant region extends into said single crystalline silicon layer from a third point on said top surface between said channel region and said first point, such that said third implant region is defined by a third edge that, for said first portion, curves from said third point into said first implant region and into said second implant region and that, for said second portion, curves from within said first implant region and said second implant region to below said first edge and to said trench isolation region, and such that said third implant region contains a dopant, having a specific conductivity type, from said top surface to said third edge; and performing an anneal process so as to recrystallize said first implant region and said second implant region such that said carbon present in said second implant region causes said second implant region to impart a predetermined stress on said channel region upon recrystallization.

2. The method of claim 1, said performing of said multiple implantation processes comprising:

forming a first spacer adjacent to said gate stack; and implanting said carbon into said single crystalline silicon layer such that said second implant region is formed.

3. The method of claim 2, said performing of said multiple implantation processes comprising:

after said second implant region is formed, removing said first spacer;

forming, on said gate stack, a second spacer that is narrower than said first spacer; and implanting said amorphizing species into said single crystalline silicon layer such that said first implant region is formed and said second implant region within said first implant region is completely amorphized.

4. The method of claim 1, said forming of said gate stack comprising:

forming a gate dielectric layer;

forming a gate polysilicon layer on said gate dielectric layer; and forming a nitride cap on said gate polysilicon layer so that, when said second implant region is formed, said gate polysilicon layer is protected and remains free of said carbon so that a depth of said second implant region can be at least one-half a height of said gate stack.

5. The method of claim 4, said multiple implantation processes further being performed such that said nitride cap is removed before said third implant region is formed.

6. The method of claim 5, further comprising pre-doping said gate polysilicon layer with said dopant such that, after said third implant region is formed, a dose of said dopant in said gate polysilicon layer is greater than that in said third implant region.

7. The method of claim 1, further comprising, before said performing of said laser anneal, forming a stress memorization technique (SMT) straining layer, having a given type of strain, above said single crystalline silicon layer and said gate stack such that said laser anneal further imparts said given type of strain on said single crystalline silicon layer, said gate stack and said channel region.

8. The method of claim 1, said amorphizing species comprises at least one of germanium, xenon, argon and silicon.

9. The method of claim 1, said performing of said anneal comprising performing one of a laser anneal, a flash anneal, a rapid thermal anneal, and a furnace anneal.

10. The method of claim 1, said predetermined stress comprising a tensile stress.

11. A method of forming a semiconductor device, said method comprising:

providing a single crystalline silicon layer having a top surface and a bottom surface opposite said top surface;

forming a trench isolation region in said single crystalline silicon layer to define a first section of said single crystalline silicon layer and a second section of said single crystalline silicon layer;

forming an n-type transistor in said first section of said single crystalline silicon layer and a p-type transistor in said second section of said single crystalline semiconductor layer, said forming of said n-type transistor and said p-type transistor comprising:

forming a first gate stack on said first section and a second gate stack on said second section so as to designate a first channel region for said n-type transistor and a second channel region for said p-type transistor, respectively; and for said n-type transistor, performing a multiple implantation processes so as to form a first implant region, a second implant region and a third implant region in said first section of said single crystalline silicon layer between said first channel region and said trench isolation region, said multiple implantation processes being performed such that said first implant region extends into said single crystalline silicon layer from a first point on said top surface, such that said first implant region is defined by a first edge that curves from said first point to said trench isolation region and such that said first implant region contains an amorphizing species from said top surface to said first edge, said multiple implantation processes further being performed such that said second implant region extends into said single crystalline silicon substrate from a second point on said top surface between said first point and said trench isolation region, such that said second implant region is defined by a second edge that curves from said second point to said trench isolation region and that is between said top surface and said first edge so that said second implant region is contained entirely within said first implant region and such that said second implant region contains carbon from said top surface to said second edge, and said multiple implantation processes further being performed such that said third implant region has a first portion adjacent to said channel region and a second portion that is deeper than said first portion ant that is between said first portion and said trench isolation region, such that third implant region extends into said single crystalline silicon layer from a third point on said top surface between said channel region and said first point, such that said third implant region is defined by a third edge that, for said first portion, curves from said third point into said first implant region and into said second implant region and that, for said second portion, curves from within said first implant region and said second implant region to below said first edge and to said trench isolation region, and such that said third implant region contains an n-type dopant from said top surface to said third edge; and performing an anneal process so as to recrystalize said first implant region and said second implant region such that said carbon present in said second implant region causes said second implant region to impart a tensile stress on said first channel region upon recrystallization.

12. The method of claim 11, said amorphizing species comprising at least one of germanium, xenon, argon and silicon.

13. The method of claim 11, said performing of said anneal comprising performing one of a laser anneal, a flash anneal, a rapid thermal anneal, and a furnace anneal.

14. The method of claim 11, said first gate stack and said second gate stack each being formed with a nitride cap such that, when said second implant region is formed, said first gate stack is protected and remains free of said carbon.

15. The method of claim 14, said nitride cap on said first gate stack allowing said second implant region to be formed to a depth that is at least one-half a height of said first gate stack.

16. The method of claim 14, said multiple implantation processes further being performed such that said nitride cap is removed from said first gate stack before said third implant region is formed.

17. The method of claim 16, said forming of said n-type transistor and said p-type transistor further comprising: during said forming of said first gate stack and said second gate stack, pre-doping a gate polysilicon layer of-said first gate stack with said n-type dopant such that, after said third implant region is formed, a dose of said n-type dopant in said gate polysilicon layer is greater than that in said third implant region.

18. The method of claim 14, further comprising, before said performing of said anneal, forming a stress memorization technique (SMT) straining layer, having a tensile strain, above said first section of said single crystalline silicon layer and said first gate stack of said n-type transistor such that said laser anneal causes said tensile strain to be imparted on said first section of said single crystalline silicon layer, said first gate stack and said first channel region.

19. The method of claim 11, said forming of said n-type transistor and said p-type transistor further comprising: for said p-type transistor,
  removing a portion of said second section of said single crystalline silicon layer to form a recess adjacent to said second channel region;
  epitaxially growing a silicon germanium film in said recess adjacent to said second channel region; and
  implanting a p-type dopant into said silicon germanium film.

* * * * *